(12) United States Patent
Rasheed et al.

(10) Patent No.: US 7,964,040 B2
(45) Date of Patent: Jun. 21, 2011

(54) MULTI-PORT PUMPING SYSTEM FOR SUBSTRATE PROCESSING CHAMBERS

(75) Inventors: Muhammad M. Rasheed, Fremont, CA (US); Dmitry Lubomirsky, Cupertino, CA (US); James Santosa, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 457 days.

(21) Appl. No.: 12/265,641

(22) Filed: Nov. 5, 2008

(65) Prior Publication Data

US 2009/0120464 A1 May 14, 2009

Related U.S. Application Data

(60) Provisional application No. 60/986,332, filed on Nov. 8, 2007.

(51) Int. Cl.
*B08B 5/00* (2006.01)

(52) U.S. Cl. .............. 134/21; 134/1; 134/1.1; 134/18; 134/22.1; 134/22.11; 134/26; 134/30; 134/31; 134/37; 134/42; 134/96.1; 134/98.1; 134/186; 134/902

(58) Field of Classification Search .......... 134/1, 1.1, 134/18, 21, 22.1, 22.11, 26, 30, 31, 37, 42, 134/96.1, 98.1, 186, 902
See application file for complete search history.

(56) References Cited

U.S. PATENT DOCUMENTS

| | | |
|---|---|---|
| 4,147,571 A | 4/1979 | Stringfellow et al. |
| 4,848,400 A | 7/1989 | Grant et al. |
| 5,016,332 A | 5/1991 | Reichelderfer et al. |
| 5,081,069 A | 1/1992 | Parker et al. |
| 5,125,360 A | 6/1992 | Nakayama et al. |
| 5,148,714 A | 9/1992 | McDiarmid |
| 5,252,178 A | 10/1993 | Moslehi |
| 5,304,250 A | 4/1994 | Sameshima et al. |
| 5,443,647 A | 8/1995 | Aucoin et al. |
| 5,558,717 A | 9/1996 | Zhao et al. |
| 5,569,350 A | 10/1996 | Osada et al. |
| 5,587,014 A | 12/1996 | Iyechika et al. |
| 5,630,881 A | 5/1997 | Ogure et al. |

(Continued)

FOREIGN PATENT DOCUMENTS

CN  1830072 A  6/2006

(Continued)

OTHER PUBLICATIONS

Search Report for Application SG 200808260-4 mailed on Jul. 2, 2009, 4 pages.

(Continued)

*Primary Examiner* — Sharidan Carrillo
(74) *Attorney, Agent, or Firm* — Kilpatrick Townsend & Stockton LLP

(57) ABSTRACT

An exhaust foreline for purging fluids from a semiconductor fabrication chamber is described. The foreline may include a first, second and third ports independently coupled to the chamber. A semiconductor fabrication system is also described that includes a substrate chamber that has a first, second and third interface port. The system may also include a multi-port foreline that has a first, second and third port, where the first foreline port is coupled to the first interface port, the second foreline port is coupled to the second interface port, and the third foreline port is coupled to the third interface port. The system may further include an exhaust vacuum coupled to the multi-port foreline.

4 Claims, 3 Drawing Sheets

U.S. PATENT DOCUMENTS

| | | | |
|---|---|---|---|
| 5,635,409 A | 6/1997 | Moslehi |
| 5,683,518 A | 11/1997 | Moore et al. |
| 5,853,607 A | 12/1998 | Zhao et al. |
| 6,009,830 A | 1/2000 | Li et al. |
| 6,021,785 A | 2/2000 | Grutzediek et al. |
| 6,024,044 A | 2/2000 | Law et al. |
| 6,077,412 A | 6/2000 | Ting et al. |
| 6,156,581 A | 12/2000 | Vaudo et al. |
| 6,302,964 B1 | 10/2001 | Umotoy et al. |
| 6,383,954 B1 | 5/2002 | Wang et al. |
| 6,387,207 B1 | 5/2002 | Janakiraman et al. |
| 6,406,677 B1 | 6/2002 | Carter et al. |
| 6,447,651 B1 | 9/2002 | Ishikawa et al. |
| 6,450,117 B1 | 9/2002 | Murugesh et al. |
| 6,508,879 B1 | 1/2003 | Hashimoto |
| 6,528,332 B2 | 3/2003 | Mahanpour et al. |
| 6,548,416 B2 | 4/2003 | Han et al. |
| 6,614,181 B1 | 9/2003 | Harvey et al. |
| 6,656,540 B2 | 12/2003 | Sakamoto et al. |
| 6,660,391 B1 | 12/2003 | Rose et al. |
| 6,660,662 B2 | 12/2003 | Ishikawa et al. |
| 6,676,751 B2 | 1/2004 | Solomon et al. |
| 6,793,733 B2 | 9/2004 | Janakiraman et al. |
| 6,794,290 B1 | 9/2004 | Papasouliotis et al. |
| 6,812,157 B1 | 11/2004 | Gadgil |
| 6,830,624 B2 | 12/2004 | Janakiraman et al. |
| 6,833,052 B2 | 12/2004 | Li et al. |
| 6,867,086 B1 | 3/2005 | Chen et al. |
| 6,884,685 B2 | 4/2005 | Luo et al. |
| 6,890,403 B2 | 5/2005 | Cheung |
| 6,900,067 B2 | 5/2005 | Kobayashi et al. |
| 6,935,466 B2 | 8/2005 | Lubomirsky et al. |
| 6,958,112 B2 | 10/2005 | Karim et al. |
| 7,018,902 B2 | 3/2006 | Visokay et al. |
| 2001/0006070 A1 | 7/2001 | Shang et al. |
| 2001/0021595 A1 | 9/2001 | Jang et al. |
| 2001/0024691 A1 | 9/2001 | Kimura et al. |
| 2001/0029892 A1 | 10/2001 | Cook et al. |
| 2001/0040099 A1 | 11/2001 | Pederson et al. |
| 2001/0054387 A1 | 12/2001 | Frankel et al. |
| 2002/0127350 A1 | 9/2002 | Ishikawa et al. |
| 2002/0139307 A1 | 10/2002 | Ryding et al. |
| 2002/0163637 A1* | 11/2002 | Rossman et al. ........... 356/237.4 |
| 2002/0185067 A1* | 12/2002 | Upham .......................... 118/715 |
| 2003/0064154 A1 | 4/2003 | Laxman et al. |
| 2003/0073310 A1 | 4/2003 | Olgado et al. |
| 2003/0094773 A1 | 5/2003 | Lerner |
| 2003/0159656 A1 | 8/2003 | Tan et al. |
| 2003/0172872 A1 | 9/2003 | Thakur et al. |
| 2004/0008334 A1 | 1/2004 | Sreenivasan et al. |
| 2004/0048492 A1 | 3/2004 | Ishikawa et al. |
| 2004/0065253 A1 | 4/2004 | Tois et al. |
| 2004/0079118 A1 | 4/2004 | M'Saad et al. |
| 2004/0134773 A1 | 7/2004 | Pederson et al. |
| 2004/0144490 A1 | 7/2004 | Zhao et al. |
| 2004/0146661 A1 | 7/2004 | Kapoor et al. |
| 2004/0159343 A1 | 8/2004 | Shimbara et al. |
| 2004/0161899 A1 | 8/2004 | Luo et al. |
| 2004/0175501 A1 | 9/2004 | Lukas et al. |
| 2004/0211664 A1 | 10/2004 | Wang |
| 2005/0001556 A1 | 1/2005 | Hoffman et al. |
| 2005/0217578 A1 | 10/2005 | Gurary et al. |
| 2005/0250340 A1 | 11/2005 | Chen et al. |
| 2006/0075967 A1 | 4/2006 | Lu et al. |
| 2006/0096540 A1 | 5/2006 | Choi |
| 2006/0251499 A1 | 11/2006 | Lunday et al. |
| 2007/0080057 A1 | 4/2007 | Mizohata et al. |
| 2007/0128864 A1 | 6/2007 | Ma et al. |
| 2007/0235062 A1 | 10/2007 | Fujiwara et al. |
| 2007/0277734 A1 | 12/2007 | Lubomirsky et al. |
| 2009/0120584 A1 | 5/2009 | Lubomirsky et al. |

FOREIGN PATENT DOCUMENTS

| | | |
|---|---|---|
| DE | 19654737 A1 | 7/1997 |
| EP | 1717848 A | 11/2006 |
| EP | 1791161 A2 | 5/2007 |
| JP | 09-008014 A | 1/1997 |
| JP | 2007-324154 A | 12/2007 |
| KR | 0204793 B1 | 3/1999 |
| KR | 1020000011360 A | 2/2000 |
| KR | 1020020013383 A | 2/2002 |
| KR | 1020060103640 A | 10/2006 |
| WO | WO 03/066933 A | 8/2003 |
| WO | WO 2005/078784 A | 8/2005 |
| WO | WO 2006/014034 A1 | 2/2006 |
| WO | WO 2007/140376 A | 12/2007 |
| WO | WO 2007/140424 A | 12/2007 |

OTHER PUBLICATIONS

Coltrin, M.E., et al., "Chemistry of AlGaN Particulate Formation," National Nuclear Security Administration, Physical, Chemical, & Nano Sciences Center, Research Briefs, 2005, pp. 42-43.

Kang, Hun, "A Study of the Nucleation and Formation of Multifunctional Nanostructures using GaN-Based Materials for Device Applications," Georgia Institute of Technology, Doctor of Philosophy in the School of Electrical & Computer Engineering Dissertation, Dec. 2006, p. 14.

Korean Office Action "Notice to File a Response" mailed Jul. 27, 2010, Korean application No. 10-2008-0110390,3 pages.

PCT International Search Report mailed Dec. 23, 2009; International Application No. PCT/US2009/041402; 12 pages.

Extended European Search Report mailed Mar. 3, 2010; Application No. 08168783.2; 8 pages.

* cited by examiner

MULTI-PORT PUMPING SYSTEM FOR SUBSTRATE PROCESSING CHAMBERS

CROSS-REFERENCES TO RELATED APPLICATIONS

The present application claims benefit under 35 USC 119 (e) of U.S. provisional Application No. 60/986,332, filed on Nov. 8, 2007, entitled "Multi-Port Pumping System For Reduced Cleaning Pressure In Dielectric Deposition Chambers," the content of which is incorporated herein by reference in its entirety.

BACKGROUND OF THE INVENTION

One of the primary steps in the fabrication of modern semiconductor devices is the formation of a layer, such as a silicon oxide layer, on a substrate or wafer. As is well known, such a layer can be deposited by chemical vapor deposition (CVD). In a conventional thermal CVD process, reactive gases are supplied to the substrate surface where heat-induced chemical reactions take place to form the desired film. In a conventional plasma CVD process, a controlled plasma is formed using, for example, radio frequency (RF) energy or microwave energy to decompose and/or energize reactive species in reactant gases to produce the desired film.

Unwanted deposition on areas such as the walls of the processing chamber also occurs during such CVD processes. As is known in the industry, it is common to remove the unwanted deposition material that builds up on the interior of chamber walls with an in situ chamber clean operation. Common chamber cleaning techniques include the use of an etchant gas, such as fluorine, to remove the deposited material from the chamber walls and other areas. In some processes, the etchant gas is introduced into the chamber and a plasma is formed so that the etchant gas reacts with and removes the deposited material from the chamber walls. Such cleaning procedures are commonly performed between deposition steps for every wafer or every n wafers.

Some semiconductor manufactures employ a remote plasma cleaning process as an alternative to an in situ plasma cleaning, a remote plasma cleaning procedure may be employed in which an etchant plasma is generated remote from the substrate processing chamber by a high density plasma source such as a microwave plasma system, toroidal plasma generator or similar device. Dissociated species from the etchant plasma are then transported to the substrate processing chamber where they can react with and etch away the undesired deposition build up. Remote plasma cleaning procedures are sometimes used by manufacturers because they provide a "softer" etch than in situ plasma cleans, i.e., there is less ion bombardment and/or physical damage to chamber components because the plasma is not in contact with chamber components.

In one known type of remote plasma cleaning procedure, nitrogen trifluoride ($NF_3$) is introduced into a remote plasma system (RPS) where it is activated by microwave power. The RPS dissociates the $NF_3$ into reactive fluorine groups (e.g., radical F atoms and ions) that are transported to the substrate processing chamber to react with the residual deposition materials (e.g., silicon oxide) that have built up on the chamber sidewall and other exposed surfaces in the deposition chamber. The RPS system is often mounted on an external surface of the deposition chamber (e.g., the top of the chamber) and flows the activated cleaning gas into the chamber.

The activated cleaning gas may include the activated $NF_3$ source gas to which a carrier gas such as helium or argon (Ar) may optionally be added. The rate at which the activated cleaning gas flows from the RPS into the deposition chamber is often limited by the construction of the RPS. For example, an ASTRONe RPS, manufactured by MKS Instruments Inc., is rated for a 4.0 SLM flow while an ASTRONex RPS system is rated for a 6.0 SLM flow. To keep the flow of the activated cleaning gas circulating through the chamber, a foreline is kept open to connect the chamber to an exhaust (e.g., dry) pump. The vacuum pulled by the dry pump causes cleaning gas to exit the chamber through the foreline.

In the 300 mm Ultimata HDP-CVD chamber, manufactured by Applied Materials, the portion of the foreline through which cleaning gases are exhausted is coupled to a single port running between the chamber and a roughing pump. The port is of a fixed size and has a limited flow capacity that cannot accommodate increased input flows of the cleaning gas beyond a certain point without an increase in the chamber pressure. Thus, when the ASTRON RPS units referred to above are used with the 300 mm Ultima chamber, a flow rate of the activated cleaning gas was typically in the range of between 2 to 4.5 Standard Liters per Minute (SLM). At such flow rates chamber pressure can readily be kept within an ideal range for efficient cleaning. When a higher flow RPS unit that can generate flow of activated cleaning gas in the range of 10 to 15 SLM, the single port foreline cannot remove the gas at a fast enough rate and the chamber pressure rises above an ideal range resulting in a decrease in the cleaning efficiency of the activated cleaning gas. For example, when the cleaning gas pressure climbs above about 9 Torr, more gas is used and the cleaning rate actually decreases compared to a lower chamber pressure. This limitation on the input flow rate of cleaning gas results in longer chamber cleaning times and reduces its throughput or productivity.

BRIEF SUMMARY OF THE INVENTION

In view of the above, the inventors have recognized a need for new foreline designs that can maintain the cleaning gas pressure in a deposition chamber at an optimum level when the input flow rate is increased. Embodiments of the invention include an improved foreline design where multiple ports (e.g., two or more ports) may be used in the foreline to remove spent cleaning gases from the chamber.

According to one embodiment of the invention, a multi-port exhaust foreline for purging fluids from a substrate processing chamber is provided where the foreline includes first, second and third ports independently coupled to the chamber. The first, second and third ports are fluidly coupled together and merge into a single port that is operatively coupled to an exit vacuum. In one specific embodiment, the three ports intersect at a cross fitting that has a fourth port that is coupled to the exit vacuum.

According to another embodiment, a substrate processing system is provided that comprises a substrate processing chamber having a substrate processing region within the chamber; a substrate support having a substrate receiving surface positioned within the substrate processing chamber for securing a substrate during substrate processing in the substrate processing region of the chamber; and a gas exhaust system comprising a turbo molecular pump, a gate valve that can be closed to fluidly isolate the turbo molecular pump from the chamber and first and second gas exhaust pathways that are fluidly coupled to an exhaust foreline. The first gas exhaust pathway includes a first conduit coupled to a port positioned on the substrate processing system to exhaust gases pumped through the turbo molecular pump from the substrate processing chamber into the exhaust foreline. The second exhaust pathway includes at least second and third conduits coupled to second and third interface ports positioned on the substrate processing system to, when the gate valve is closed fluidly isolating the turbo molecular pump from the chamber, exhaust gases from the substrate processing chamber into the exhaust foreline. In some embodiments of the substrate processing system, the second gas exhaust pathway includes a fourth conduit coupled to a fourth interface port positioned on the substrate processing system to, when the gate valve is closed fluidly isolating the turbo molecular pump from the chamber, exhaust gases from the substrate processing chamber into the exhaust foreline. Also, in some embodiments, the second, third and fourth interface ports are positioned in substantially the same horizontal plane and spaced approximately 90 degrees from each other and positioned below the substrate support. The substrate processing system may include a roughing pump operatively coupled to the exhaust foreline downstream from the first, second, third and fourth conduits as well as a second throttle valve operatively coupled in the second gas passageway between the second, third and fourth conduits and the roughing pump.

In one embodiment a method of cleaning a substrate processing chamber is provided. The method introduces an activated cleaning gas mixture into the chamber; reacts at least a portion of the cleaning mixture with residue materials in the chamber; and removes the cleaning mixture from the reaction chamber through multiple exhaust ports fluidly coupled together and operatively coupled to a vacuum pump. The cleaning gas mixture is a fluorine-containing compound generated from a plasma formed outside the chamber in a remote plasma system. In one specific embodiment, the cleaning gas mixture comprises nitrogen tri-fluoride and the activated cleaning gas comprises fluorine ions and fluorine radicals, and is introduced into the chamber at a flow rate between 10-15 SLM while chamber pressure is maintained at or below 9 Torr.

In another embodiment, a method of operating a substrate processing system having a substrate processing chamber and a gas exhaust system comprising a turbo molecular pump, a gate valve that can be closed to fluidly isolate the turbo molecular pump from the substrate processing chamber and first and second gas exhaust pathways that are fluidly coupled to an exhaust foreline is provided. The method includes (i) transferring a substrate into the chamber and performing a substrate processing operation on the substrate by introducing one or more process gases into the chamber while the substrate is positioned within the chamber and exhausting the one or more process gases from the chamber into the exhaust foreline with the turbo molecular pump through a first exhaust pathway fluidly coupled to the chamber at a first port downstream from the turbo molecular pump, wherein unwanted residue material builds-up on interior surfaces of the substrate processing chamber during the substrate processing operation; and (ii) transferring the substrate out of the chamber, closing the gate valve to isolate the turbo molecular pump from the chamber and performing a chamber clean operation by introducing an activated cleaning gas mixture into the chamber, reacting at least a portion of the cleaning mixture with the residue material, and removing the cleaning gas mixture from the chamber through a second exhaust passageway having at least second and third ports fluidly coupled to the chamber upstream from the turbo molecular pump. In one embodiment the second exhaust pathway further includes a fourth port fluidly coupled to the chamber upstream from the turbo molecular pump.

In one specific embodiment, the invention utilizes three vacuum interface ports available on the throttle body of a conventional semiconductor deposition chamber. The three ports, which are upstream of a turbo molecular pump, are fluidly coupled together and to the exhaust foreline to allow increased pumping capability without the need for a major and expensive redesign of existing chambers. Embodiments of the invention also allow existing chambers to be retrofitted from a single port foreline design to a two or three port foreline design to increase the pumping capacity of the existing chamber.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION OF THE INVENTION

Figure 1:
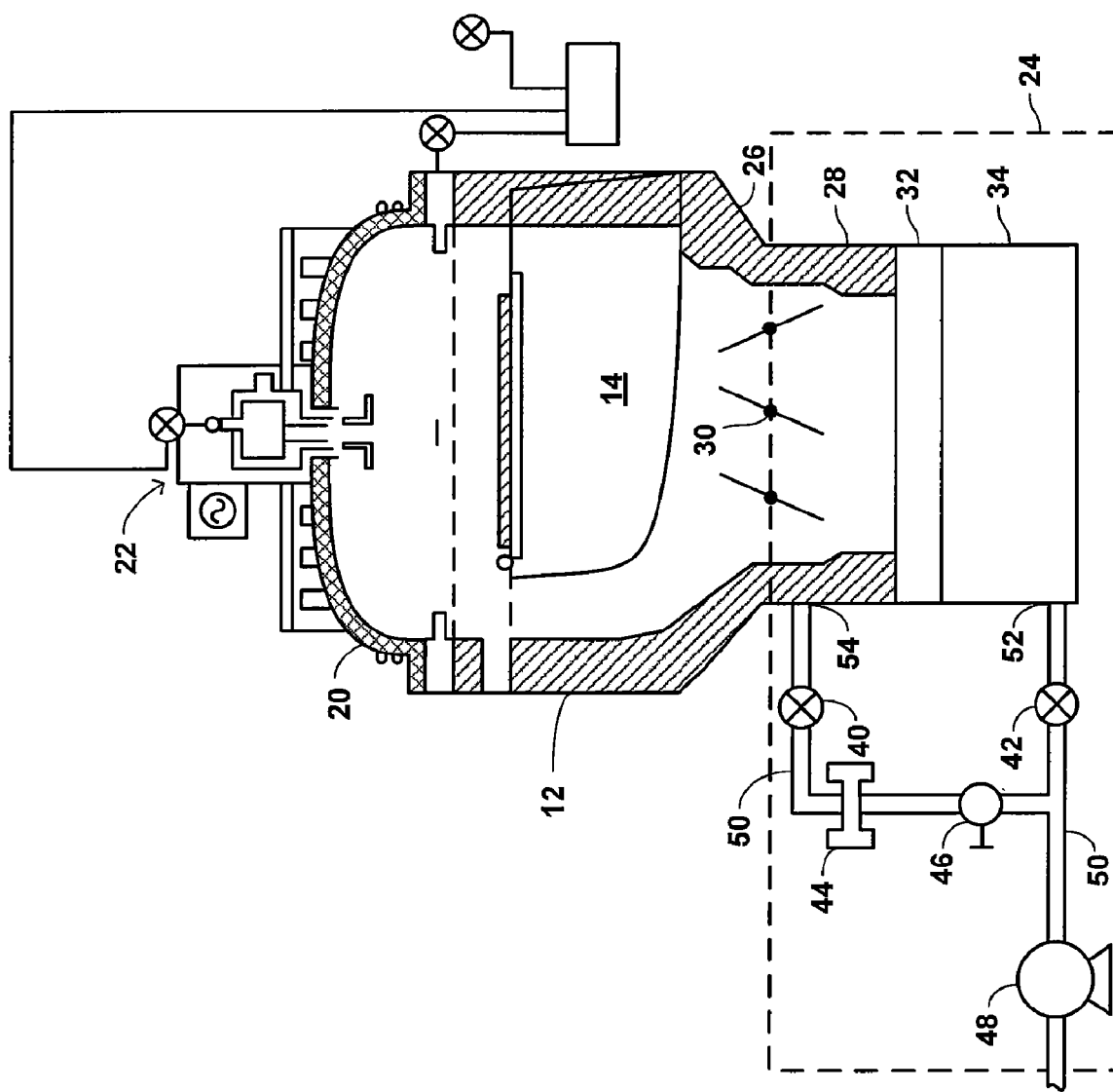
FIG. 1 shows a conventional, single-port foreline that fluidly couples a deposition chamber to an exit pump during a chamber clean operation.

FIG. 1 is a simplified cross-sectional view of a high density plasma chemical vapor deposition (HDP-CVD) system 10 in which the techniques according to the present invention can be employed to increase the pumping capacity of system 10 during a chamber clean operation. CVD system 10 includes, among other elements, a chamber body 12, a substrate support 14 (e.g., an electrostatic chuck), gas nozzles 16, 18, a chamber dome 20, a remote plasma cleaning system 22 and a vacuum system 24. Chamber body 12, dome 20 and substrate support 14 combine to define a processing region 15 in which a substrate 2 is positioned during a substrate processing operation, such as a chemical vapor deposition operation. For convenience, numerous features of system 10 that are not directly relevant to the invention have been omitted from FIG. 1 and are not discussed herein. For example, system 10 includes a gas distribution system that delivers process gases to gas nozzles 16, 18, as well as source and bias plasma systems that are coupled to the chamber to provide energy to form a plasma within the chamber from the process gases introduced into the chamber.

Vacuum system 24 includes a body member 26 that forms a lower portion of chamber 12 and joins the chamber to the vacuum system, and a throttle body 28, which houses a threeblade throttle valve 30 and is attached to a gate valve 32 and a turbo-molecular pump 34, which allow accurate and stable control of chamber pressures as low as about 1 mTorr during substrate processing operations. Gate valve 32 can isolate pump 34 from the throttle body 30 and process region 15.

Vacuum system 24 also includes additional isolation valves 40 and 42, an endpoint detector 44, an additional throttle valve 46 and a roughing pump 48. During substrate processing operations, isolation valve 40 is closed while gate valve 32 and isolation valve 42 are open. Gases are exhausted into a foreline 50 through port 52 and gas conduit 50a. Pressure during substrate processing operations is controlled by throttle valve 30. During a chamber clean operation, gate valve 32 and isolation valve 42 are closed while valve 40 is open. The cleaning gas is exhausted into foreline 50 through port 54 and gas conduit 50b. Pressure during the chamber cleaning operation is controlled by throttle valve 46. Gas conduits 50a and 50b are part of gas foreline 50.

In some CVD chambers 10 such as some Ultima HDP-CVD chambers manufactured by Applied Materials, chamber body 12, body member 26 and throttle body 28 are welded together to form an integral housing. Port 54 on that housing is of a fixed size and can be coupled to the foreline by appropriate fittings. The housing also includes two additional ports not shown in FIG. 1 (shown in FIG. 2 as ports 56, 58). These additional ports 56, 58 are located at about the same height on chamber 10 as port 54 (and thus on substantially the same horizontal plane) but are located 90 degrees to the left and right of port 54 and thus would face towards and away from the figure page, respectively. Each of ports 54, 56, 58 are upstream (with respect to gas flow into and out of the chamber during substrate processing and chamber clean operations) from gate valve 32 and turbo molecular pump 34.

These additional ports are typically used to couple devices such as a pressure gauge or purge of helium gas to chamber 10. In one embodiment of the invention, however, these additional ports 56, 58 are coupled directly to the foreline with appropriate fittings to provide gas flow paths to the foreline in addition to the path through port 54 during a chamber cleaning operation and thereby increase the pumping capacity of chamber 10 during a chamber cleaning operation.

Figure 2:
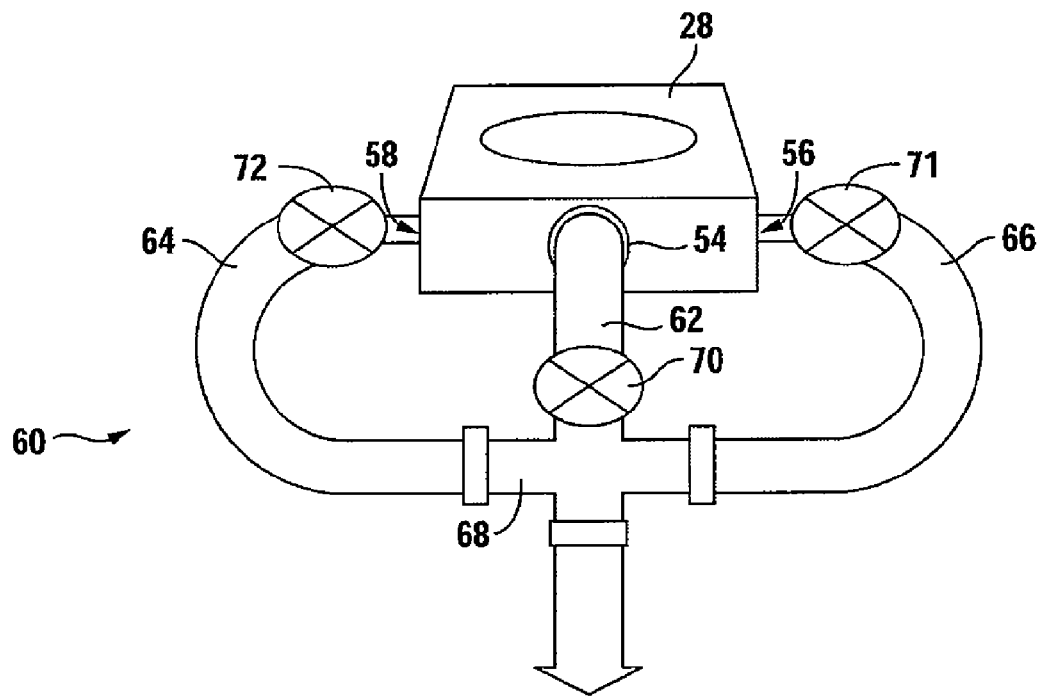
FIG. 2 shows a simplified schematic of a foreline according to one embodiment of the invention.

FIG. 2 shows a simplified schematic view of a foreline 60 according to embodiments of the invention. Foreline 60, which can replace foreline portion 50b in FIG. 1, includes gas conduit sections 62, 64, 66 that respectively couple to three ports 54, 56, 58 on a substrate processing chamber such as chamber 10. Sections 62, 64, 66 intersect and are fluidly coupled together at a cross fitting 68, which can be used to couple the portion of the foreline shown in FIG. 2 to the remainder of the foreline and to roughing pump 48. Separate isolation valves 70, 71 and 72 are positioned between cross fitting 68 and each of ports 54, 56 and 58, respectively. In another embodiment, shown in FIG. 3, instead of using separate isolation valves 70-72 for each segment of the foreline coupled to ports 54, 56 and 58, a single isolation valve 74 is positioned between cross fitting 68 and roughing pump 48. Furthermore, end point detector 44 and throttle valve 46 may be operatively coupled to the foreline between cross-fitting 68 and roughing pump 48 in each of the embodiments shown in FIGS. 2 and 3.

Figure 3:
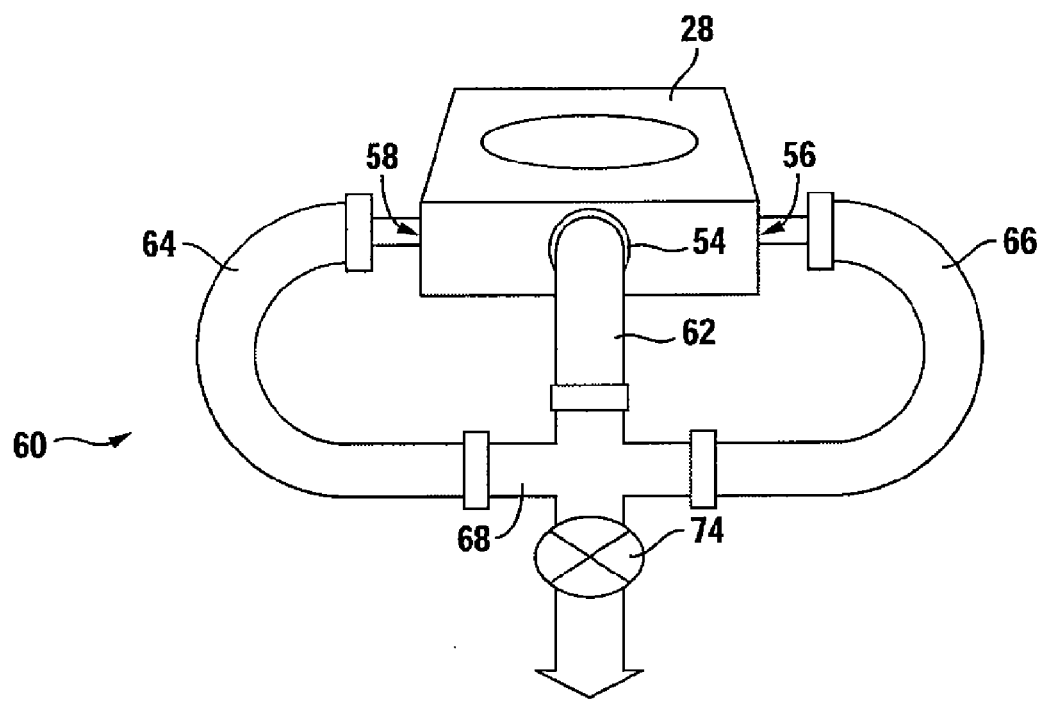
FIG. 3 shows a simplified schematic of a foreline according to another embodiment of the invention.

In certain Ultima HDP-CVD chambers, the center port (port 54) has a larger diameter opening than the side ports (ports 56, 58). Thus, when embodiments of the invention shown in FIGS. 2 and 3 are used in conjunction with such chambers, the various connectors used to connect sections 64 and 66 to the chamber will have a smaller diameter at the point of connection to the chamber than that of the center connector 62. In one embodiment, cross-fitting 68 connects to each of the three foreline sections 62, 64 and 66 with the same size coupling which is also the same diameter as the coupling used to connect to port 54. Thus, in this embodiment various adapters can be used to change diameter of sections 64, 66 to ensure proper mating and gas tight seals along each portion of and the entire length of the foreline. A person of skill in the art will recognize that the present invention is not limited to any particular parts used to create the configurations shown in FIGS. 2 and 3 or other configurations of the invention. Furthermore, the skilled artisan will recognize that the such parts are a matter of design choice and may include multiple sections, pipes, valves, couplings, clamps, o-rings and other parts as necessary to create a desired arrangement for a particular chamber.

Figure 4:
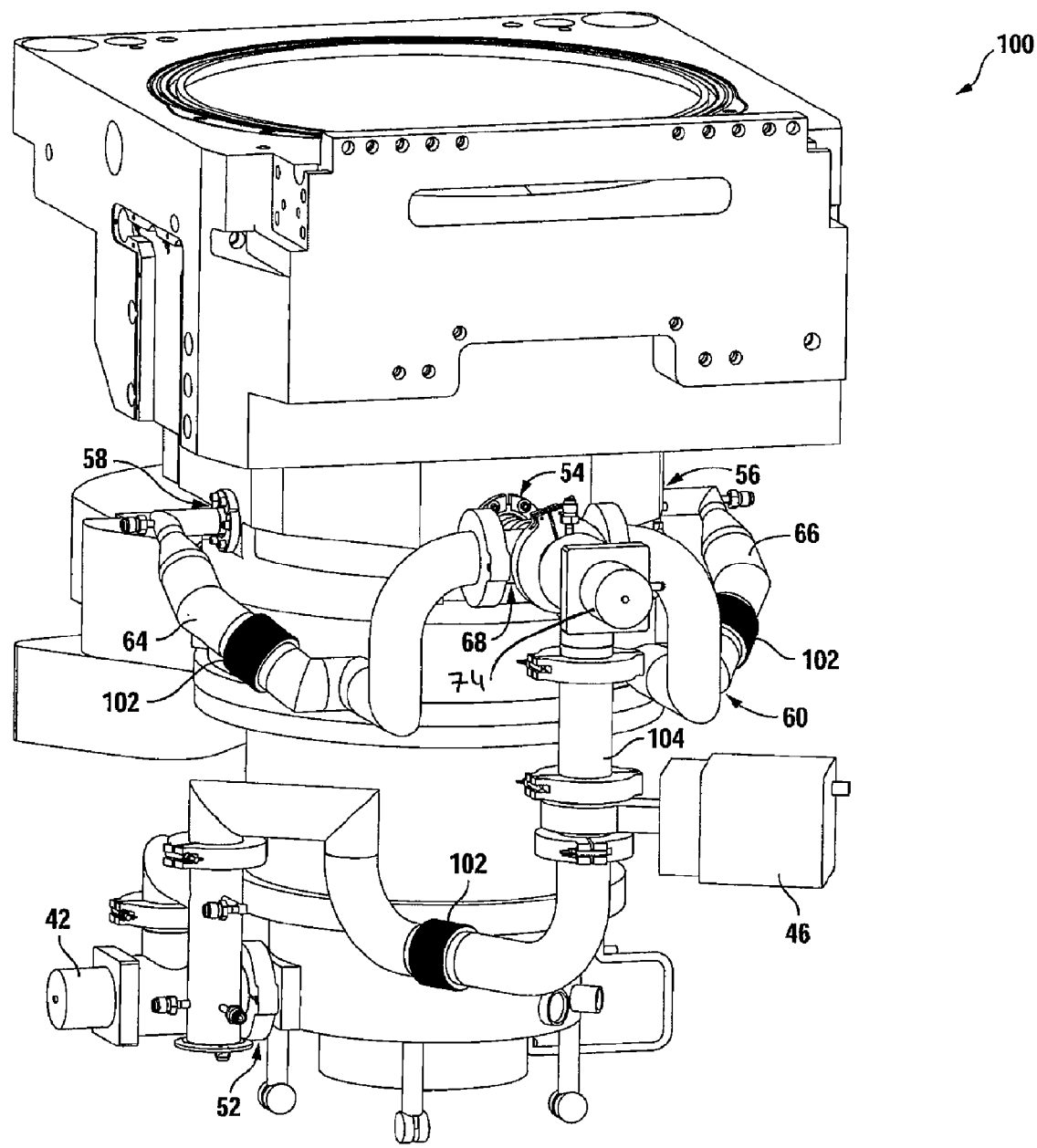
FIG. 4 shows a simplified perspective view of an HDP-CVD chamber fitted with a foreline according to one embodiment of the invention.

FIG. 4 is a simplified perspective view of a semiconductor fabrication system 100 fitted with a foreline 60 according to an embodiment of the invention. System 100 may be, for example, a 300 mm Ultima HDP-CVD deposition chamber or another type of chamber. System 100 may be used to deposit and/or etch dielectric films (such as silicon oxide, silicon oxynitride, silicon nitride, etc.) on substrate wafers.

As shown in FIG. 4, foreline 60 is coupled to three output ports near the bottom of the chamber at approximately the height of the throttle valve and oriented at 90° angles from each other. A first interface port 54 from the chamber is coupled to a first section of the foreline with a KF50 sized coupler. Second and third chamber interface ports 56, 58 at 90° angles to first port 54 are coupled to second and third sections of the foreline, respectively, with KF25 sized couplers. In this embodiment, the three foreline ports intersect at a cross fitting 68, which has a forth port coupled to a shutoff valve 74 that can isolate sections 62, 64 and 66 of the foreline from the gas flowing through valve 42 and the lower section of the foreline during a substrate processing operation. Also shown in FIG. 4 are bellows 102, which allow some adjustment to the position of various sections of the foreline with respect to each other enabling easier installation of the foreline and better fit.

The embodiment of the system shown in FIG. 4 includes a pipe section 104 that in some embodiments is replaced with an end-point detector (EPD), such as detector 44 shown in FIG. 1. Such an EPD detects when the pressure of cleaning gas in the chamber is low enough to indicate the end of a cleaning cycle or process. Throttle valve 46 is also positioned in the foreline, downstream of section 104 but it can readily be positioned upstream of section 104 or at other locations along the foreline between connector 68 and the roughing pump.

As previously mentioned, a multiport foreline as described above can provide increased pumping capacity during a chamber clean operation to allow for increased flow of activated clean gases during a chamber clean operation. For example, when a 300 mm Ultima HDP-CVD chamber retrofitted with a three port foreline upstream of the turbo molecular pump as described with respect to FIG. 4, the system has sufficient pumping capacity for a high flow rate RPS to introduce an activated cleaning gas into the chamber at a rate between 10-15 SLM while maintaining chamber pressure below 9 Torr and specifically to enable chamber pressure to be maintained at 6 Torr at a 15 SLM flow rate of the activated cleaning gas. The inventors have also found that the multiport foreline provides better clean uniformity during a chamber clean operation. It is believed that the improved uniformity is due at least in part to pumping clean gases from multiple ports spaced apart from each other over 180 degrees of the interior perimeter of the chamber body.

Having described several embodiments, it will be recognized by those of skill in the art that various modifications, alternative constructions, and equivalents may be used without departing from the spirit of the invention. For example, FIGS. 2-4 each disclosed adding two additional ports to the foreline for exhausting cleaning gases, some embodiments of the invention may use just one of the two additional ports saving the third port for other purposes such as the connection of a pressure gauge or helium supply. As another example, while the invention was described primarily with respect to an HDP-VD chamber, it can also be employed with other types of deposition chambers as well as etch chambers and other chamber. Additionally, a number of well-known processes and elements have not been described in order to avoid unnecessarily obscuring the present invention. Accordingly, the above description should not be taken as limiting the scope of the invention.

As used herein and in the appended claims, the singular forms "a", "an", and "the" include plural referents unless the context clearly dictates otherwise. Thus, for example, reference to "a process" includes a plurality of such processes and reference to "the electrode" includes reference to one or more electrodes and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of operating a substrate processing system having a substrate processing chamber and a gas exhaust system comprising a turbo molecular pump, a gate valve that can be closed to fluidly isolate the turbo molecular pump from the substrate processing chamber and first and second gas exhaust pathways that are fluidly coupled to an exhaust foreline, the method comprising:

transferring a substrate into the chamber and performing a substrate processing operation on the substrate by introducing one or more process gases into the chamber while the substrate is positioned within the chamber and exhausting the one or more process gases from the chamber into the exhaust foreline with the turbo molecular pump through the first exhaust pathway fluidly coupled to the chamber at a first port downstream from the turbo molecular pump, wherein unwanted residue material builds-up on interior surfaces of the substrate processing chamber during the substrate processing operation; and transferring the substrate out of the chamber, closing the gate valve to isolate the turbo molecular pump from the chamber and performing a chamber clean operation by introducing an activated cleaning gas mixture into the chamber, reacting at least a portion of the cleaning gas mixture with the residue material, and removing the cleaning gas mixture from the chamber through the second exhaust pathway having at least second and third ports fluidly coupled to the chamber upstream from the turbo molecular pump.

2. The method of claim 1 wherein the second exhaust pathway includes a fourth port fluidly coupled to the chamber upstream from the turbo molecular pump.

3. The method of claim 2 wherein the step of removing the activated cleaning gas mixture comprises fluorine ions and fluorine radicals generated in a remote plasma system operatively coupled to the chamber.

4. The method of claim 3 wherein the fluorine ions and fluorine radicals are generated from $NF_3$.

* * * * *